US008493151B2

(12) United States Patent
Kinyua

(10) Patent No.: US 8,493,151 B2
(45) Date of Patent: Jul. 23, 2013

(54) METHOD AND APPARATUS FOR PROGRAMMABLE GAIN CONTROL USEFUL WITH DIGITAL TO ANALOG CONVERTER

(75) Inventor: Martin Kinyua, Cedar Park, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

(21) Appl. No.: 13/269,850

(22) Filed: Oct. 10, 2011

(65) Prior Publication Data

US 2013/0088293 A1    Apr. 11, 2013

(51) Int. Cl.
*H03G 3/30*    (2006.01)
(52) U.S. Cl.
USPC ......................................................... 330/279
(58) Field of Classification Search
USPC .................................. 330/278–279, 252–261
See application file for complete search history.

(56) References Cited

U.S. PATENT DOCUMENTS 7,719,362 B2 *    5/2010    Hossack et al. ............... 330/282
8,198,941 B2 *    6/2012    Lesso ............................ 330/297

OTHER PUBLICATIONS

"Stereo Audio Volume Control", Burr-Brown Products from Texas Instruments, PGA2310, Oct. 2001, 18 pages.
Rueger, T. et al., "A 110dB Ternary PWM Current-Mode Audio DAC with Monolithic 2Vrms Driver", IEEE International Solid-State Circuits Conference, 2004, Session 20/ Digital-To-Analog Converters/ 20.7, 10 pages.

* cited by examiner

*Primary Examiner* — Hieu Nguyen
(74) *Attorney, Agent, or Firm* — Duane Morris LLP

(57) ABSTRACT

A programmable gain controller (PGC) useful with a digital to analog converter is coupled to an input node providing a current source that is variable with a level of an input signal such as time sampled audio data, and multiple switches controlled to function as a digital gain control. Each switch is configured to selectively steer a variable fraction of the current provided by a current source to either a current sink node or to an output node of the PGC to provide at least one scaled current. An amplifier is coupled to an output of the PGC. The amplifier is configured to convert scaled current(s) to at least one output signal having an amplitude that is a function of both the input signal level and the digital gain input signal. Controlling the gain by steering current at the analog portion of the apparatus conserves circuit space and reduces noise.

22 Claims, 5 Drawing Sheets

METHOD AND APPARATUS FOR PROGRAMMABLE GAIN CONTROL USEFUL WITH DIGITAL TO ANALOG CONVERTER

BACKGROUND

In various signal processing applications, programmable gain control plays an important role for overall system performance. In one known gain control approach, a digital code is converted to a current source by a delta-sigma digital-to-analog converter (delta sigma DAC). An amplifier in a non-inverting feedback configuration converts the current to a voltage at an output of the amplifier using voltage division with resistors around an amplifier feedback loop. In such an approach, large resistors and their associated metal interconnect can introduce large parasitic reactive components (e.g., capacitance) at the non-inverting node of the amplifier and can add to circuit delay and make amplifier compensation more difficult, e.g., over a wide range of gain and frequency.

In another known approach, digital gain programming is used, e.g., in audio applications, to control volume by numerically adjusting the signal amplitude in the digital domain. Digital volume reduction using various techniques results in fewer bits being available to represent an audio signal, while retaining the same noise level. This reduces the signal to noise ratio (SNR) or the dynamic range of the entire signal processing chain. In other words, the resolution of the audio signal is degraded by the noise floor when digital gain programming is used.

SUMMARY

In an embodiment of the present disclosure, a programmable gain controller (PGC) includes at least one input node for providing at least one current source that is variable as a function of a level of an input signal, and multiple switches that are controllable as a function of a digital gain input signal. Each switch is configured to selectively steer a fraction of the current provided by at least one of the current sources to either a current sink node or to an output node of the PGC, thereby providing at least one scaled current. An amplifier is coupled to an output of the PGC. The amplifier is configured to convert the scaled current(s) to at least one output signal having an amplitude that is a function of both the input signal level and the digital gain input signal.

In one embodiment, at least one current source that is variable with a level of an input signal is provided. Based on a digital gain input, a variable fraction of the current provided by at least one of the current sources is selectively steered or allocated to either a current sink node, or to a scaled current node to provide at least one scaled current. The scaled current(s) is converted to at least one output signal having an amplitude that is a function of both the input signal and the digital gain input.

In an embodiment, an apparatus includes a programmable gain controller (PGC), an amplifier, and a current sink. The PGC includes multiple switches controllable as a function of a digital gain input signal. The PGC is configured to scale a first current source, provided at a first PGC input node, and a second current source, provided at a second PGC input node to provide a first scaled current at a first PGC output node and a second scaled current at a second PGC output node. Each current source is variable with a level of an input signal. The PGC is configured to scale the first and second current sources based on the digital gain input. The amplifier has first and second input terminals coupled to the first and second PGC output nodes, respectively. The amplifier is configured to convert the first and second scaled currents to at least one output signal having an amplitude that is a function of both the input signal and the digital gain input. The current sink includes a first sink circuit coupled to the first PGC output node and configured to sink a first sink current, and a second sink circuit coupled to the second PGC output node and configured to sink a second sink current. Each sink circuit includes multiple switches controllable by the digital gain input to yield the sum of the currents entering the amplifier equal to the sum of the first and second sink currents.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description.

Figure 1:
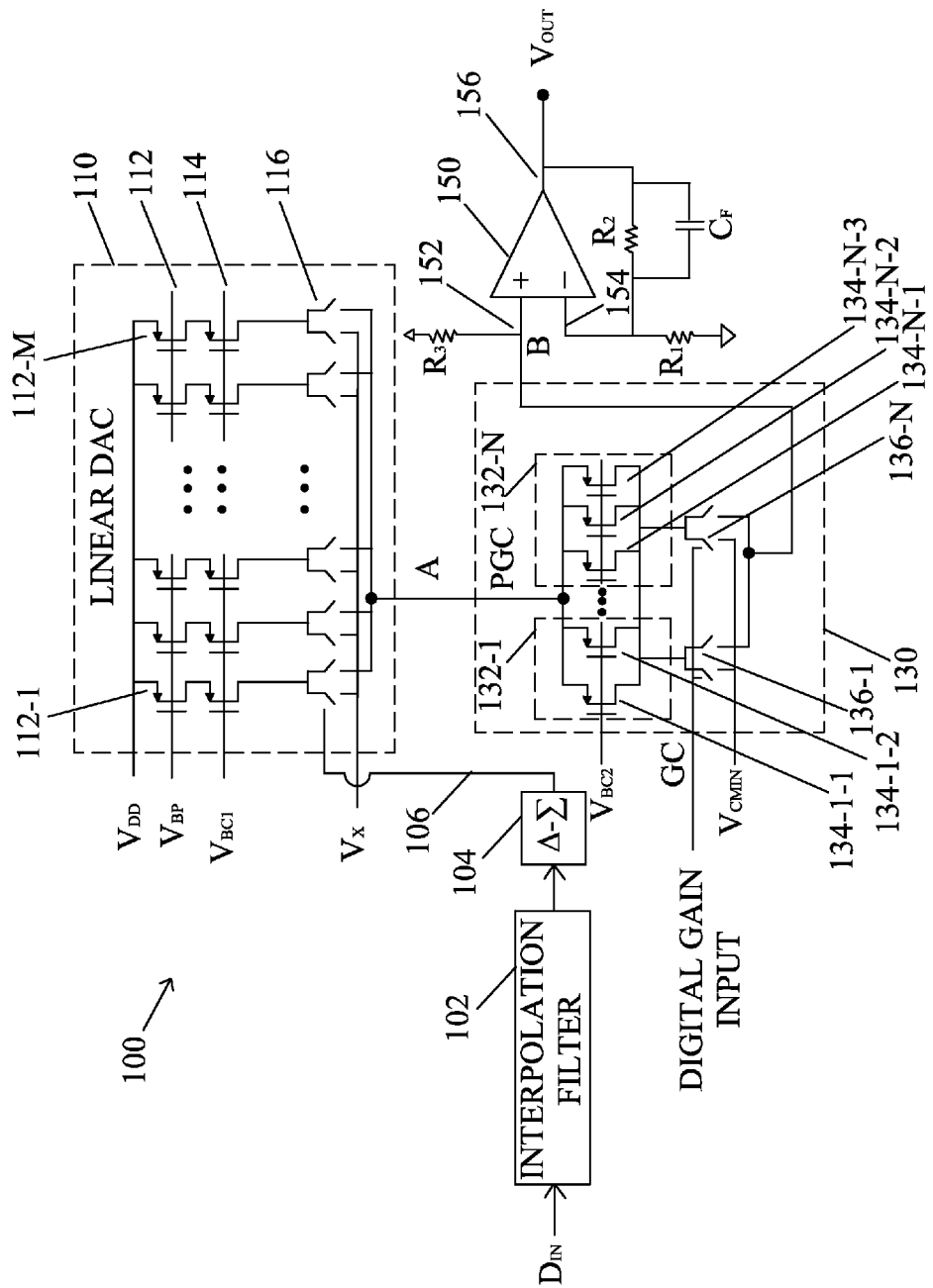
FIG. 1 is a schematic diagram of a signal processing circuit in accordance with an exemplary embodiment.

FIG. 1 is a schematic diagram of a signal processing circuit 100 in accordance with an exemplary embodiment. A digital code $D_{IN}$ is provided, e.g., a numeric value representing a time sampled amplitude, obtained by reading from a compact disc (CD) or decoding a compressed audio data file or received in a streamed transmission, among other examples. The digital code may be processed, for example interpolated at filter 102 to provide a higher sample rate and then processed by a digital delta-sigma modulator (DSM) to provide a bitstream 106 that has an average density of set bits per unit time, representing a signal level of the input to the DSM.

Digital signal 106 is provided to a linear digital to analog converter (DAC) 110 that generates an analog signal representing signal 106 using a current steering architecture. In the example of FIG. 1, switches 116 in an array are individually controlled by signal 106 to steer an incremental current value either to a sink node Vx or to node A, where the incremental currents are summed, thereby allocating proportions of a maximum possible current between the sink node Vx and the summing node A. The switches are coupled to transistors arranged in a cascode configuration as shown in FIG. 1, with an array of transistors 112-1, ..., 112-M (collectively transistors 112) feeding an array of transistors 114, which feed switches 116 for steering. Transistors 112 and 114 may be PMOS transistors. Thus, a subset of the transistors of the DAC are coupled to the switches of the DAC. The cascode configuration is useful, among other reasons, for favorable output impedance, by increasing the output impedance of the current sources. Transistors 114 and switches 116 may be individually denoted, e.g., as 114-1, ..., 114-M and 116-1, ..., 116-M, but are not shown as such in FIG. 1 for visual convenience only. DAC 110 is a linear DAC because any number of the M switches 116 may be controlled to steer current to node A, thereby allowing the current at node A to assume values that vary linearly depending on input signal 106.

A programmable gain controller (PGC) 130 provides gain control in the analog domain. For audio signal processing applications, adjusting the amplitude or volume in the analog domain decreases the signal as well as the noise, thereby maintaining peak SNR, unlike the known approach of scaling the signal in the digital domain described previously. PGC 130 includes switches 136-1, . . . , 136-N (collectively switches 136) that are controllable as a function of a digital gain input GC. Each switch is configured to selectively steer a fraction of the current provided by the current source to either a current sink node (here denoted $V_{cmin}$) or to an output node of the PGC (here denoted node B) to provide a scaled current. PGC 130 includes multiple sets of transistors, with each set 132-1, . . . , 132-N (collectively sets 132) having one or more associated transistors, which may be PMOS transistors. Each set 132 is coupled to one of the switches 136. In the example of FIG. 1, set 132-1 has transistors, 134-1-1 and 134-1-2, and set 132-N has transistors 134-N-1, 134-N-2, and 134-N-3. Each transistor is coupled to node A. The total number of transistors coupled to node B via the switches, based on the digital gain input signal GC, determines the amount of gain provided by PGC 130. A selectable number of the associated transistors are enabled to be selectively coupled as a unit to conduct current to node B as a function of the digital gain input signal GC. The number of transistors in each set can be configured in various ways and may be the same or different in respective sets. For example, there may be one transistor in each set (any number of transistors being selectable up to the total number provided), or there may be respective sets of 1, 2, 4, 8, etc. transistors, whereby the sets can be selected from binary values that numerically represent the number of transistors selected to steer into a summing node (current from the remaining transistors being steered to a sink node). An embodiment wherein the sets provide approximately logarithmic (e.g., $2^n$) variations in the number of transistors capable of being switched to the output node, may be advantageous in audio applications due to the human auditory system's perception of loudness on a logarithmic scale.

An amplifier 150 is coupled to output node B of the PGC 130. Amplifier 150 is configured to convert the scaled current provided by PGC 130 to at least one output signal having an amplitude that is a function of both the input signal and the digital gain input. The output signal may be a voltage signal $V_{out}$ as shown in FIG. 1, or a current signal.

Figure 2A:
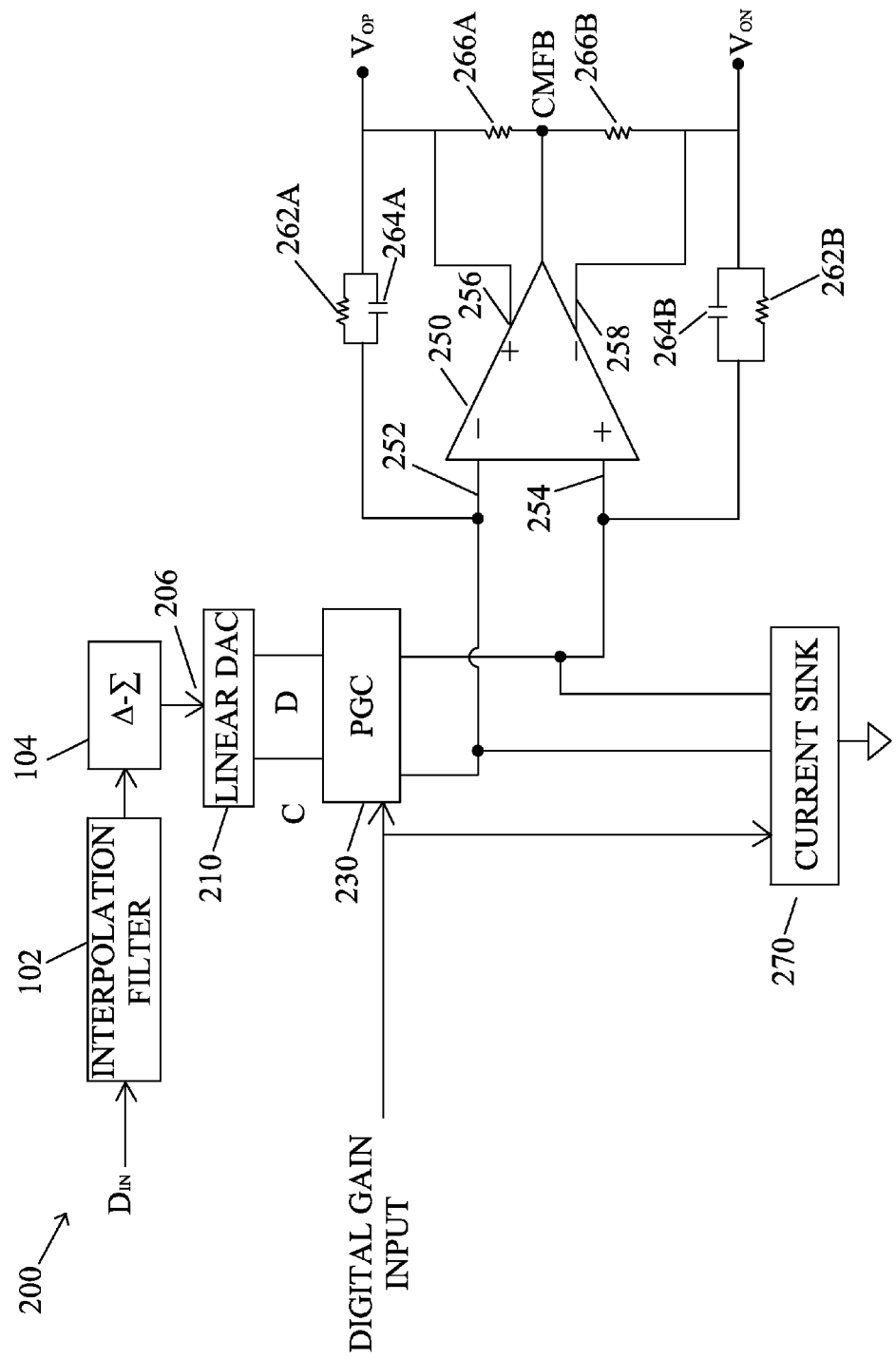
FIG. 2A is a block diagram of a signal processing circuit in accordance with an exemplary embodiment.
Figure 2B:
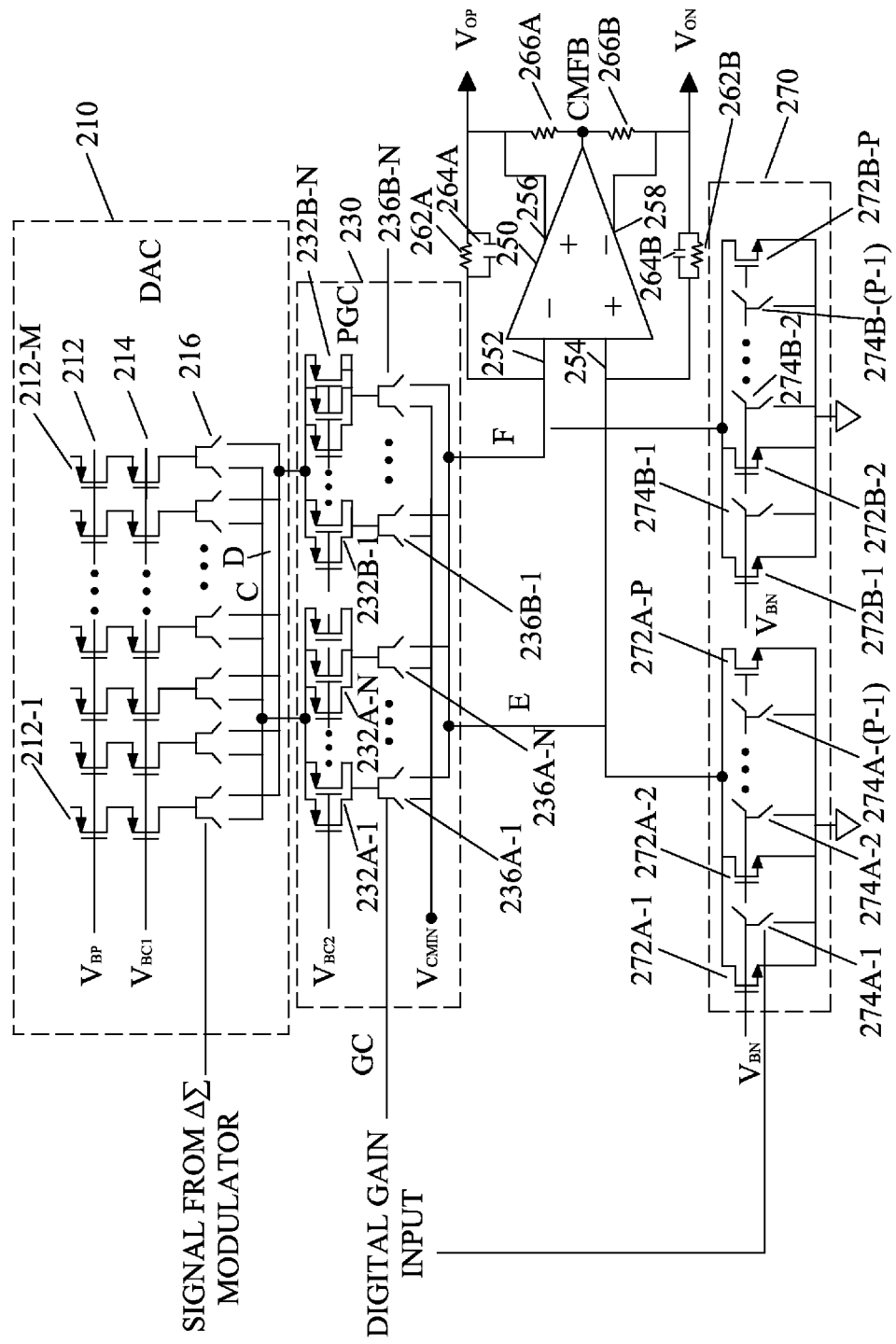
FIG. 2B is a schematic diagram providing additional details of components in FIG. 2A.

Another embodiment that may provide higher performance using a balanced, fully differential amplifier configuration is shown in FIGS. 2A-2B. In FIG. 2A, the digital code $D_{IN}$, interpolation filter 102, and delta sigma modulator 104 may be the same as in FIG. 1. Signal 102 is provided as input to a linear DAC 210, which provides current sources to nodes C and D. Programmable gain controller 230 implements gain in the analog domain and scales the current sources, based on a digital gain input, to provide inputs to a balanced differential amplifier 250. Balanced differential amplifier 250 converts the differential current input at terminals 252 and 254 to an output signal such as differential output voltage $V_{OP}$, $V_{ON}$. A current sink 270 may be used to sink some of the scaled currents provided by PGC 230 in order to maintain a common mode value of the currents. Current sink 270 scales the lumped common mode pull down current to match the total PGC current.

As shown in FIG. 2B, DAC 210 may selectively steer current from transistors 212, 214 to node C or to node D based on an input signal from delta sigma modulator 104. Thus, DAC 210 provides linearly variable current sources for nodes C and D. Switches 216 are coupled to a subset of the transistors of the DAC (in FIG. 2B, to transistors 214) to steer current.

PGC 230 provides a pair of scaling circuits coupled to respective PGC input nodes C and D and coupled to respective PGC output nodes E and F. The scaling circuit at left in FIG. 2 has sets of transistors 232*a*-1, . . . , 232*a*-N, and the scaling circuit at right has sets of transistors 232*b*-1, . . . , 232*b*-N. Switches 236*a*-1, . . . , 236*a*-N and 236*b*-1, . . . , 236*b*-N (collectively switches 236) are coupled to corresponding sets of transistors. Each scaling circuit in PGC 230 operates in a similar fashion as the scaling circuitry of PGC 130 in FIG. 1. Digital gain input GC controls switches 236 to selectively steer current from the transistors to either the node at voltage $V_{cmin}$ or to one of the PGC output nodes E or F.

Current sink 270 is coupled to PGC output nodes E and F and includes switches controllable by the digital gain input GC to selectively sink a fraction of the scaled currents. Specifically, current sink 270 includes two current sink circuits, shown at left and right in FIG. 2B, for sinking a fraction of scaled currents at nodes E and F, respectively. The circuit for sinking current from node E has P-1 switches 274*a*-1, . . . , 274*a*-(P-1) controlled by the digital gain input. The switches may be arranged with transistors 272*a*-1, . . . , 272*a*-P to control the transistors as shown. The other sink circuit, coupled to node F, has switches 274*b*-1, . . . , 274*b*-(P-1) and transistors 272*b*-1, . . . , 272*b*-P and operates in a similar fashion with the switches controlled by the digital gain input. The switches in both sink circuits are controllable in tandem with PGC 230 to cause the sum of the currents entering the amplifier at terminals 252, 254 to equal the sum of the currents sinked by current sink 270. Thus, current sink 270 balances the amplifier currents to achieve a common mode value equal to the current amplitude conducted through current sink 270, so that the differential outputs are same in magnitude and opposite in polarity when centered at this common mode value. The switches in current sink 270 may be configured in various ways in relation to transistors of the current sink, and a logic mapper or look-up table may be used to map the digital values to specific selections at the control inputs for the switches in various ways as known in the art to balance the inputs to the amplifier.

Figure 3:
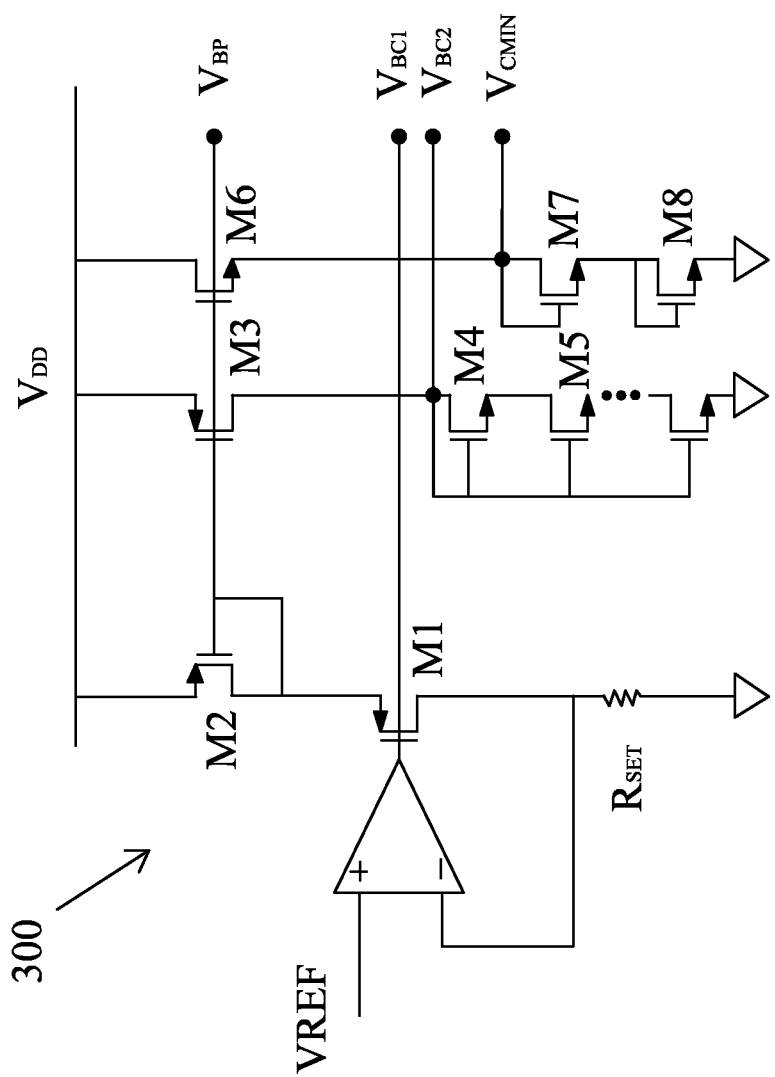
FIG. 3 is a schematic diagram of a circuit that provides various voltages depicted in FIG. 2B.

FIG. 3 is a schematic diagram of a circuit that provides various voltages used to bias the circuit in FIG. 2B. FIG. 3 shows an example circuit 300 having a current mirror topology that provides voltages $V_{bp}$, $V_{bc1}$, $V_{bc2}$, and $V_{cmin}$ based on a reference voltage $V_{ref}$ that may be provided in any of various ways known in the art, e.g., generated by a band gap reference using stacked forward-biased diodes. The reference voltage $V_{ref}$ generates a reference current, which flows through transistors M1 and M2. Transistors M3 and M6 mirror the current flowing through M2. Additional transistors may be stacked with transistors M4 and M5 depending on the value desired for $V_{bc2}$. Thus, FIG. 3 shows that a reference voltage generates a reference current, which in turn is used to generate other reference voltages at steady fixed values. The signal $V_{bn}$, shown in FIG. 2B may be generated in a similar manner, as known to one of ordinary skill.

Figure 4:
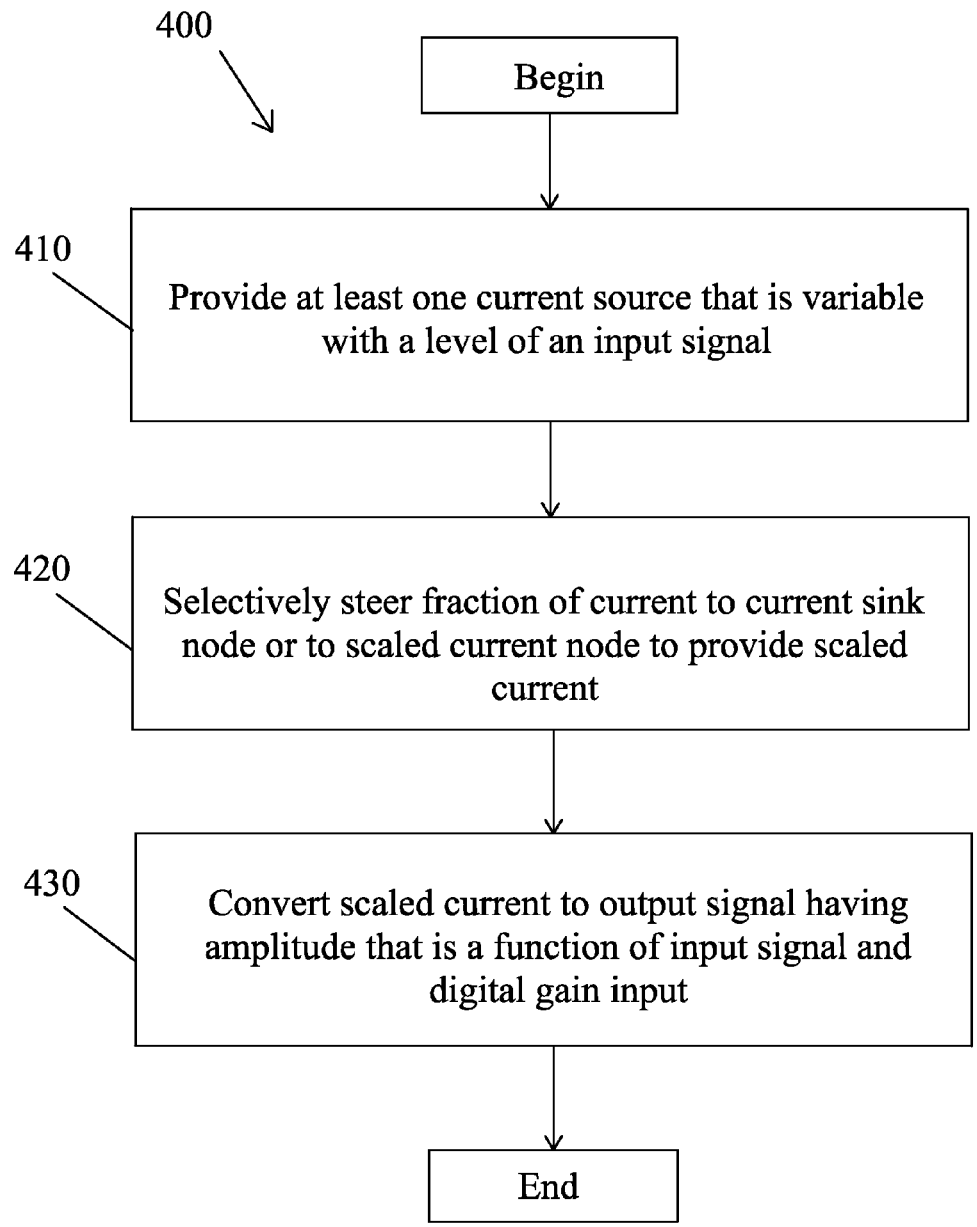
FIG. 4 is a flow diagram of a process in accordance with an exemplary embodiment.

FIG. 4 is a flow diagram of a process in accordance with an exemplary embodiment. After process 400 begins, at least one current source that is variable in amplitude with a level of an input signal is provided (410). Based on a digital gain input, a fraction of the current provided by at least one of the current sources is selectively steered (420) to either a current sink node or to a scaled current summing node to provide at least one scaled current. The scaled current(s) is converted (430) to at least one output signal having an amplitude that is a function of both the input signal and the digital gain input.

In various embodiments implemented in the audio context, the amplifier output signal may be low pass filtered and provided to an audio output device, e.g., speakers or headphones. Performing gain modification in the analog domain provides an output signal with better signal to noise ratio (SNR) than with prior art approaches. The signal to noise ratio is not degraded as in prior approaches, because whenever the signal is reduced by modification of the gain in the analog domain, the noise is also reduced. Gain programming is performed in some embodiments by using analog current division rather than feedback resistors configured around an amplifier. The output current common mode is controlled by scaling the pull down current sinks (e.g., left and right current sink circuits in current sink 270) in tandem with PGC 230 so that the total PGC current matches the total pull down current sinked. Common control bits of the digital gain input may be used for the current matching (balancing), simplifying the design.

A hardware implementation of various embodiments uses less area (smaller circuit footprint) than known approaches involving large and numerous resistors and analog CMOS switches for selecting among combinations of resistors that insert a selectively variable proportionate resistance between the feedback loop of an amplifier and the resistance from the associated amplifier input to ground. Thus, efficiency is promoted, and cost may be reduced with embodiments as described herein.

Signal distortion is reduced for at least the following reasons. Various embodiments do not distort the signal in comparison with CMOS analog switches, which are required when using resistors. Similarly, distortion due to the voltage coefficient of such resistors is reduced or eliminated, as is distortion due to self heating, grain boundaries, and bottom-surface depletion of such resistors.

Noise is also reduced in various embodiments, because the programmable gain controller can use cascode biased transistors, which do not generate any noise, in contrast to resistors, which generate thermal noise having noise power equal to $4*k*T*BW*R$, where k is Boltzmann's constant, T is temperature in degrees Kelvin, BW is bandwidth in hertz, and R is ohms of resistance.

Gain control in accordance with various embodiments does not impact the closed loop frequency response or stability of the amplifier, because the amplifier loop gain is not altered when the gain is programmed, compared to prior art techniques in which a resistor is selectively added in feedback. Additionally, gain control in various embodiments does not consume any extra power compared to prior approaches, and any device mismatch in the programmable gain circuit may introduce only a gain error rather than signal distortion.

Although examples are illustrated and described herein, embodiments are nevertheless not limited to the details shown, since various modifications and structural changes may be made therein by those of ordinary skill within the scope and range of equivalents of the claims.

What is claimed is:

1. An apparatus comprising:
    a programmable gain controller (PGC) including:
        at least one input node for providing at least one current source as an input to the PGC, said current source being variable as a function of a level of an input signal, and
        a plurality of switches controllable as a function of a digital gain input signal, each switch configured to selectively steer a variable fraction of the current provided by at least one said current source to one of a current sink node and an output node of the PGC, thereby providing at least one scaled current; and
    an amplifier coupled to an output of the PGC, the amplifier configured to convert the at least one scaled current to at least one output signal having an amplitude that is a function of both the input signal level and the digital gain input signal.

2. The apparatus of claim 1, further comprising a digital to analog converter (DAC) configured to provide the at least one current source based on the input signal.

3. The apparatus of claim 2, wherein the DAC is configured to provide a linearly variable current source.

4. The apparatus of claim 2, wherein the DAC includes a plurality of switches selectively controllable by the input signal to provide the at least one current source.

5. The apparatus of claim 4, wherein the DAC further includes a plurality of transistors, at least a subset of the transistors being coupled to the switches of the DAC.

6. The apparatus of claim 5, wherein a plurality of the transistors of the DAC are arranged in a cascode configuration.

7. The apparatus of claim 1, wherein the apparatus further comprises a delta-sigma modulator for providing the input signal.

8. The apparatus of claim 1, wherein the at least one output signal includes a differential output signal, and the amplifier comprises a balanced differential amplifier configured to provide the differential output signal at first and second amplifier outputs that are coupled in feedback to first and second amplifier inputs, respectively.

9. The apparatus of claim 1, wherein the PGC further includes a plurality of sets of associated transistors, each set including one or more transistors, the transistors in all the sets being coupled to one of the input nodes of the PGC.

10. The apparatus of claim 9, wherein the PGC is configured to enable a selectable number of said associated transistors to be selectively coupled as a unit to conduct current to the output node of the PGC as a function of the digital gain input signal.

11. The apparatus of claim 10, wherein each switch is coupled to one of the sets of transistors, and the PGC is configured to enable the selectable number of transistors by controlling the switches to couple a selectable number of sets to the output node.

12. The apparatus of claim 11, wherein the number of transistors in each set is configured to provide a logarithmic variation in a number of the associated transistors capable of being switched to the output node.

13. The apparatus of claim 11, wherein the numbers of the associated transistors in the respective sets are powers of two.

14. The apparatus of claim 1, further comprising a current sink coupled to the output node of the PGC, the current sink including a plurality of switches controllable by the digital gain input signal to selectively sink a fraction of at least one of the scaled currents.

15. The apparatus of claim 14, wherein:
    the PGC includes a first input node providing a first current source, a second input node providing a second current source, a first output node providing a first scaled current and a second node providing a second scaled current;
    the amplifier comprises a balanced differential amplifier;
    the current sink includes a first sink circuit, coupled to the first output node and configured to sink a first sink current, and a second sink circuit, coupled to the second output node and configured to sink a second sink current; and the switches in the first and second sink circuits are controllable to yield the sum of the currents entering the amplifier equal to the sum of the first and second sink currents.

16. The apparatus of claim 15, wherein each sink circuit includes:
    a predetermined number N of transistors; and
    N−1 switches, each switch selectively coupling an input of said switch to a gate of one of the transistors or to a ground node;
    wherein the switches are controllable by the digital gain input signal.

17. The apparatus of claim 14, wherein the amplifier comprises a balanced differential amplifier, and the switches of the current sink are controllable to yield a common mode voltage equal to the current amplitude conducted through the current sink for the balanced differential amplifier.

18. A method comprising:
    providing at least one current source as an input to a programmable gain controller (PGC), said at least one current source being variable as a function of a level of an input signal;
    based on a digital gain input signal inputted to the PGC, selectively steering a variable fraction of the current provided by at least one said current source to one of a current sink node and a scaled current node, thereby providing at least one scaled current;
    converting the at least one scaled current to at least one output signal having an amplitude that is a function of both the input signal level and the digital gain input signal.

19. The method of claim 18, wherein the input signal is a digital input signal, the method further comprising selecting a number of switches controllable by the digital input signal for converting the digital input signal to the at least one scaled current.

20. The method of claim 18, wherein the at least one scaled current is converted to at least one voltage signal at least partly by a balanced differential amplifier.

21. The method of claim 18, wherein the converting is performed by a balanced differential amplifier, the method further comprising selectively sinking a fraction of at least one of the scaled currents to yield a common mode voltage equal to zero for the balanced differential amplifier.

22. An apparatus comprising:
    a programmable gain controller (PGC) including a plurality of switches controllable as a function of a digital gain input signal, the PGC configured to scale a first current source, provided at a first PGC input node, and a second current source, provided at a second PGC input node to provide a first scaled current at a first PGC output node and a second scaled current at a second PGC output node, each current source being variable as a function of a level of an input signal, the PGC configured to scale the first and second current sources based on the digital gain input signal;
    an amplifier having first and second input terminals coupled to the first and second PGC output nodes, respectively, the amplifier configured to convert the first and second scaled currents to at least one output signal having an amplitude that is a function of both the input signal level and the digital gain input signal; and
    a current sink including:
        a first sink circuit coupled to the first PGC output node and configured to sink a first sink current;
        a second sink circuit coupled to the second PGC output node and configured to sink a second sink current;
    wherein each sink circuit includes a plurality of switches controllable by the digital gain input signal to yield the sum of the currents entering the amplifier equal to the sum of the first and second sink currents.

* * * * *